(12) United States Patent
Gorcea

(10) Patent No.: US 8,063,316 B2
(45) Date of Patent: Nov. 22, 2011

(54) SPLIT WAVE COMPENSATION FOR OPEN STUBS

(75) Inventor: Dan Gorcea, Ottawa (CA)

(73) Assignee: Flextronics AP LLC, Broomfield, CO (US)

( * ) Notice: Subject to any disclaimer, the term of this patent is extended or adjusted under 35 U.S.C. 154(b) by 1135 days.

(21) Appl. No.: 11/818,508

(22) Filed: Jun. 14, 2007

(65) Prior Publication Data

US 2008/0308313 A1  Dec. 18, 2008

(51) Int. Cl.
*H05K 1/11* (2006.01)
(52) U.S. Cl. ........ 174/262; 174/260; 174/261; 174/266; 361/778; 361/791; 361/795; 361/803; 428/209; 428/413; 428/824; 333/33; 333/219; 333/200
(58) Field of Classification Search .......... 174/262, 174/260, 261, 266; 361/778, 791, 795, 803; 428/209, 413, 824; 333/33, 219, 200; 336/200
See application file for complete search history.

(56) References Cited

U.S. PATENT DOCUMENTS

| | | | |
|---|---|---|---|
| 5,438,297 A * | 8/1995 | Rahal-Arabi et al. ........ | 327/565 |
| 6,388,208 B1 * | 5/2002 | Kiani et al. .................... | 174/266 |
| 7,161,820 B2 * | 1/2007 | Funaba et al. .................. | 365/52 |
| 2002/0009577 A1 * | 1/2002 | Takaya et al. .................. | 428/209 |
| 2002/0057171 A1 * | 5/2002 | Patel et al. ..................... | 336/200 |
| 2002/0085364 A1 * | 7/2002 | Downes et al. ................ | 361/816 |
| 2002/0132898 A1 * | 9/2002 | Takaya et al. .................. | 524/445 |
| 2002/0175775 A1 * | 11/2002 | Lillo et al. ........................ | 333/1 |
| 2003/0072130 A1 * | 4/2003 | Tsang et al. ................... | 361/679 |
| 2003/0133279 A1 * | 7/2003 | Shirasaki ....................... | 361/795 |
| 2004/0136169 A1 * | 7/2004 | Morimoto et al. ............. | 361/780 |
| 2005/0003199 A1 * | 1/2005 | Takaya et al. .................. | 428/413 |
| 2005/0091440 A1 * | 4/2005 | Isa et al. ............................. | 711/1 |
| 2005/0121766 A1 * | 6/2005 | Devnani et al. ................ | 257/691 |
| 2006/0039126 A1 * | 2/2006 | Gorcea ........................... | 361/780 |
| 2006/0090933 A1 * | 5/2006 | Wig et al. ....................... | 174/262 |
| 2006/0109066 A1 * | 5/2006 | Borysenko ..................... | 333/164 |
| 2007/0081376 A1 * | 4/2007 | Funaba et al. ................... | 365/63 |
| 2007/0091581 A1 * | 4/2007 | Gisin et al. ..................... | 361/782 |
| 2007/0130555 A1 * | 6/2007 | Osaka ............................. | 716/15 |
| 2009/0015345 A1 * | 1/2009 | Kushta et al. ................... | 333/34 |

OTHER PUBLICATIONS

PCT Application No. PCT/US2008/007380, International Search Report and Written Opinion dated Sep. 10, 2008.
PCT Application No. PCT/US2008/007380, International Preliminary Report on Patentability dated Dec. 30, 2009.
Neu, Thomas; "Designing controlled-impedance vias"; Texas Instruments; EDN, Oct. 2, 2003; obtained from www.edn.com/article/CA324403.html on Jun. 15, 2006; 6 pages.

(Continued)

*Primary Examiner* — Xiaoliang Chen
(74) *Attorney, Agent, or Firm* — Sheridan Ross PC

(57) ABSTRACT

In accordance with a first embodiment, the present invention provides a circuit substrate comprising a first surface; a second surface; a first via having a first end near said first surface and a second end near said second surface; a second via having a first end near said first surface and a second end near said second surface; a first conductive element electrically coupling said first end of said first via and said first end of said second via; a second conductive element electrically coupling said second end of said first via and said second end of said second via; an input signal line coupled to said first via; and an output signal line coupled to said second via.

26 Claims, 6 Drawing Sheets

OTHER PUBLICATIONS

Sanmina-Sci Corporation; "PCB Fabrication, Backdrilling and Blind Via Formation"; Published by Sanmina-Sci Corp.; publication date unknown; Copyright 2005; 2 pages.

Bogatin, Eric; "What is Characteristic Impedance"; Bogatin Enterprises; Reprinted with permission from "Printed Circuit Design Magazine", Jan. 2000, p. 18; 8 pages.

* cited by examiner

SPLIT WAVE COMPENSATION FOR OPEN STUBS

BACKGROUND

1. Technical Field

This invention relates generally to multilayer circuit substrates, and more particularly to conductive vias that facilitate signal propagation between intermediate layers within circuit substrates.

2. Description of the Background Art

A typical circuit substrate includes multiple conductive layers separated by electrically insulated layers. Such conductive layers intercommunicate using vias formed in the circuit substrate. Generally, vias are perpendicular bores formed through the layers of a circuit substrate by processes such as laser drilling. Such bores are filled or lined with conductive material as needed to provide electrical communication paths between the conductive layers. Vias typically pass through the entire circuit substrate, even if for example the top layer is communicating with a middle layer. Such vias are commonly known as "through-hole vias."

As data-communication speeds increase, signal integrity becomes crucial for successful data transmission. Due to the increasing signal density on circuit substrates, an increasing number of signal layers becomes unavoidable. Consequently, an increasing number of vias is needed to route signals between the conductive layers. However, at high data-communication speeds, through-hole vias may cause signal degradation.

FIG. 1 shows a cross-sectional side view of a prior art multilayer PCB 100, which includes a substrate 102, a data input line 104, a data output line 106, a via 108, and multiple ground planes 110. Note that via 108 is continuous through PCB 100. Data input line 104 routes signals to data output line 106 through an upper via portion 112 of via 108. Because only upper portion 112 of via 108 is used to facilitate signal propagation between data input line 104 and data output line 106, the unused portion of via 108 defines an open-ended stub 114.

Although through-hole vias 108 do not add significant cost to the manufacturing process, they have substantial disadvantages. Open-ended stubs 114 can cause signal degradation, jitter and eye diagram closure. For example, when an electrical signal propagates through data input line 104, the signal reaches via 108 and propagates through upper via portion 112 until a point 116 where data output line 106, upper via portion 112, and open-ended stub 114 meet. At point 116, a component of the signal propagates through data output line 106, while another component of the signal propagates through open-ended stub 114. The signal propagating through stub 114 reflects back and interferes with the signal propagating from data input line 104. Further, such open-ended stubs 114 create excess capacitance and inductance, further degrading signal integrity. Excess inductance and capacitance is another way of explaining the same phenomena of reflecting energy from an open stub. Both views are correct. When the open stub is modeled as lumped elements, then we can speak of inductance and capacitance. When the model is done with transmission lines, then one can describe as propagating signals on transmission lines with certain characteristic impedances.

FIG. 2 shows a circuit 200 corresponding to prior art multilayer PCB 100. By modeling the elements as transmission lines, one skilled in the art will easily see the negative effects of the open-ended stub 114. In FIG. 2, data input line 104 and data output line 106 of FIG. 1 are represented as transmission line element 202 and transmission line element 206, respectively. Open-ended stub 114 is represented as transmission line element 208. Because transmission line element 208 is open ended, one skilled in the art will recognize that reflections will cause signal degradation of the signal traveling from transmission line element 202 to transmission line element 208.

FIG. 3 shows a cross-sectional side view of a multilayer PCB 300 that provides a prior art solution to alleviate signal degradation caused by open-ended stubs, e.g., open-ended stub 114 of FIG. 1. Multilayer PCB 300 includes a substrate 302, a data input line 304, a data output line 306, a blind via 308, and multiple ground planes 310. As shown, blind via 308 is not continuous through PCB 300. It extends from data input line 304 only to data output line 306. Thus, there is no open-ended stub to degrade the signal. Typically, blind vias such as blind via 308 are formed by control-depth drilling (CDD) techniques known to those skilled in the art. For example, a laser drill may be used to form a bore a controlled distance through the circuit substrate. The bore may then be filled or lined with conductive material (e.g., copper) as needed. Although blind vias reduce signal degradation, the manufacturing process adds substantial cost compared to that of typical through-hole vias. Further, in the case of backplane connectors (through-hole pins), the blind via process is useless.

What are needed are less expensive systems and methods for intercommunicating signals in a multilayer circuit substrate without or with reduced signal degradation.

SUMMARY

In accordance with a first embodiment, the present invention provides a circuit substrate comprising a first surface; a second surface; a first via having a first end near said first surface and a second end near said second surface; a second via having a first end near said first surface and a second end near said second surface; a first conductive element electrically coupling said first end of said first via and said first end of said second via; a second conductive element electrically coupling said second end of said first via and said second end of said second via; an input signal line coupled to said first via; and an output signal line coupled to said second via.

The input signal line may include a conductive layer formed on an intermediate layer of said circuit substrate. The input signal layer may be physically coupled to said first via between said first end and said second end. The output signal line may include a conductive layer formed on an intermediate layer of said circuit substrate. The output signal line may be physically coupled to said second via between said first end and said second end. Said input signal line and said output signal line may have substantially equal characteristic impedance; and said first via, said second via, said first conductive element, and said second conductive element may have substantially equal characteristic impedance of substantially two times the characteristic impedance of the input signal line. At least one of said first conductive element and said second conductive element may include a microstrip or strip line, which could be right underneath the surface, so there would be no open stub. A first conductive path via said first conductive element may have substantially the same delay as a second conductive path via said second conductive element. The delay of the first conductive path consists of the delay of the first via plus the delay of first conductive element plus delay of part of the second via. The delay of the second path consists of the delay of the second conductive element plus the delay of part of the second via. The first via may have a characteristic impedance substantially equal to the characteristic impedance of said second via. At least one of said first via and said second via may include a through-hole pin connector via. The through-hole pin connector via may be suitable to receive a backplane connector pin.

In accordance with another embodiment, the present invention provides method comprising providing a circuit substrate having a first surface and a second surface; forming a first via through said circuit substrate, said first via having a first end near said first surface and a second end near said second surface; forming a second via through said circuit substrate, said second via having a first end near said first surface and a second end near said second surface; providing a first conductive element; providing a second conductive element; electrically coupling said first end of said first via to said first end of said second via using said first conductive element; electrically coupling said second end of said first via to said second end of said second via using said second conductive element; providing an input node to said first via; and providing an output node to said second via.

The input node may include an intermediate layer of said circuit substrate. The providing of an input node to said first via may include coupling said input node to said first via between said first end and said second end. The output node may include an intermediate conductive layer of said circuit substrate. The step of providing an output node to said second via may include coupling said output node to said second via between said first end and said second end. Said input signal line and said output signal line have substantially equal characteristic impedance; and said first via, said second via, said first conductive element, and said second conductive element may have substantially equal characteristic impedance of substantially two times the characteristic impedance of the input signal line. At least one of said first conductive element and said second conductive element includes a strip or microstrip. The input node may include at least one through-hole pin connector. The through-hole pin connector may be suitable to receive a backplane connector. The first conductive element and the second conductive element may be designed so that the delay of a first signal path from the input node via said first conductive element to the output node is substantially equal to the delay of a second signal path from the input node via said second conductive element to the output node. The first via may have a characteristic impedance substantially equal to the characteristic impedance of said second via.

BRIEF DESCRIPTION OF THE DRAWINGS

Embodiments of the present invention are described with reference to the following drawings, wherein like reference numbers denote like elements.

DETAILED DESCRIPTION

The following description is provided to enable any person skilled in the art to make and use the invention and is provided in the context of a particular application. Various modifications to the embodiments are possible, and the generic principles defined herein may be applied to these and other embodiments and applications without departing from the spirit and scope of the invention. Thus, the invention is not intended to be limited to the embodiments and applications shown, but is to be accorded the widest scope consistent with the principles, features and teachings disclosed herein.

Figure 1:
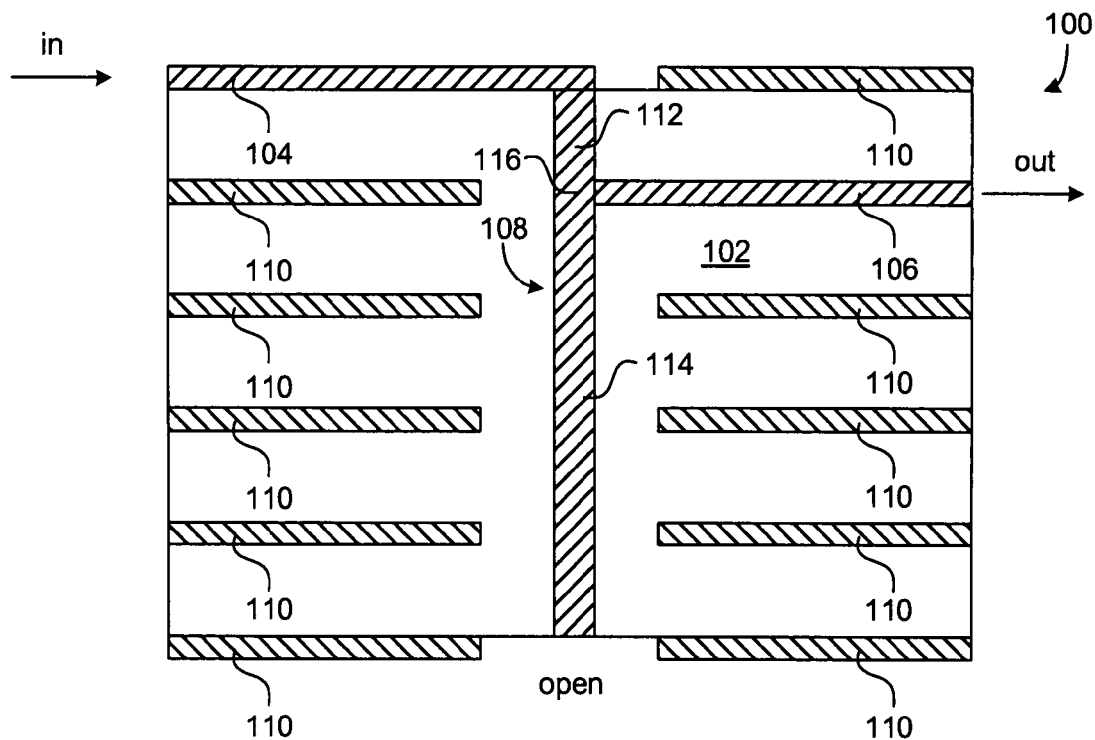
FIG. 1 is a cross-sectional side view of a prior art circuit substrate.
Figure 2:
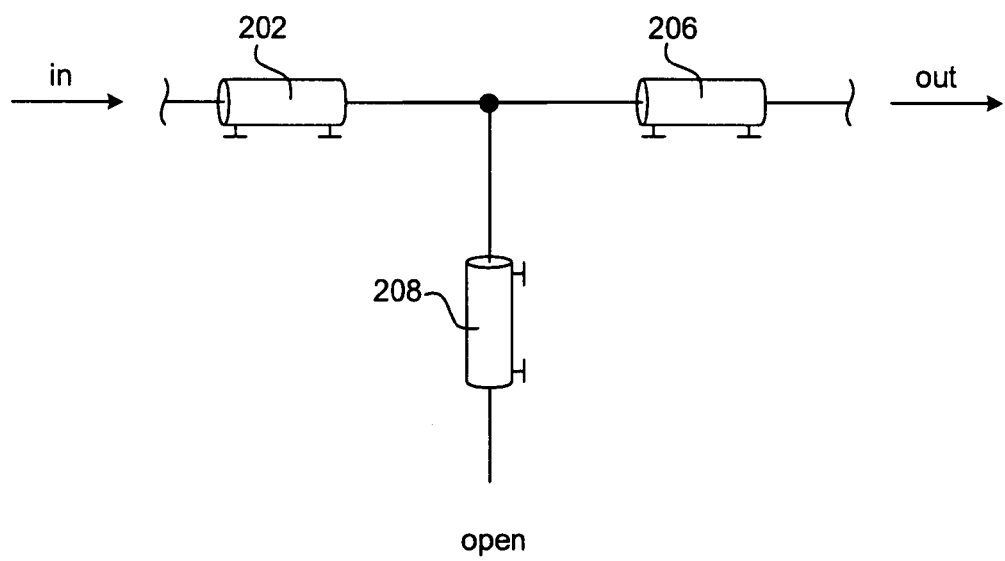
FIG. 2 is circuit diagram representing the prior art circuit substrate of FIG. 1.
Figure 3:
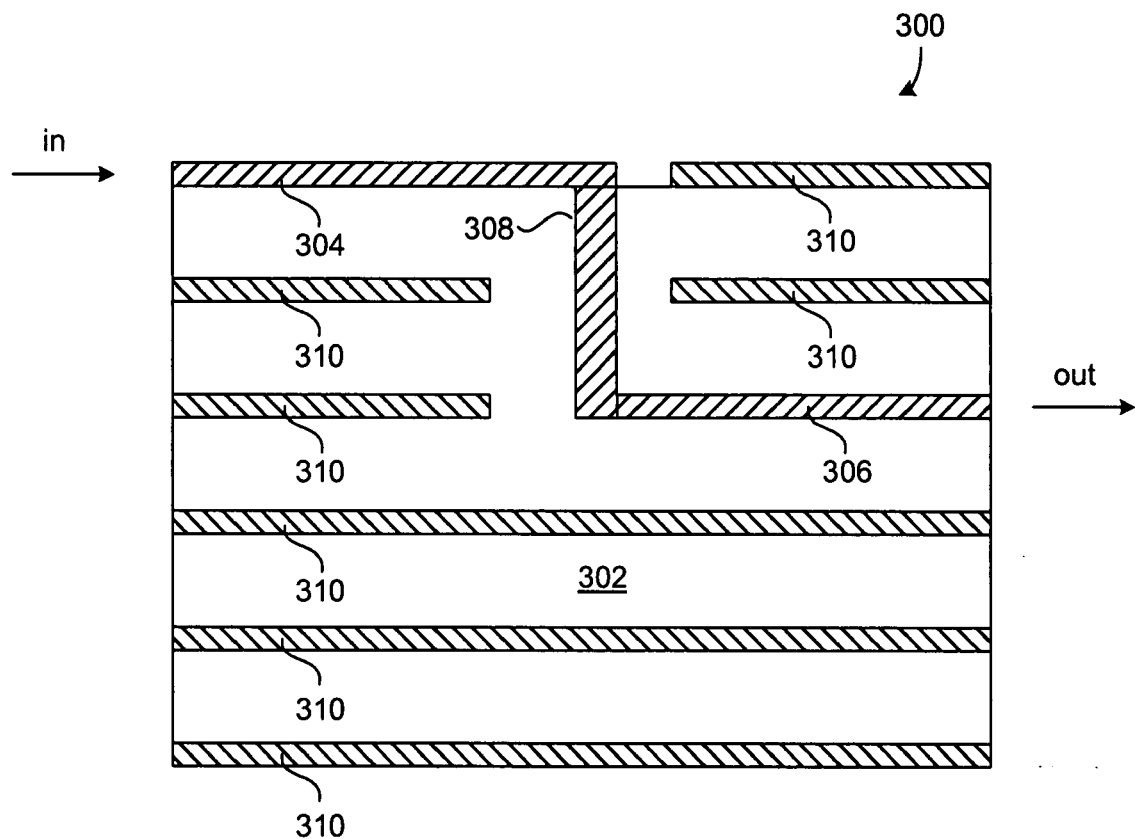
FIG. 3 is a cross-sectional side view of another prior art circuit substrate.
Figure 4:
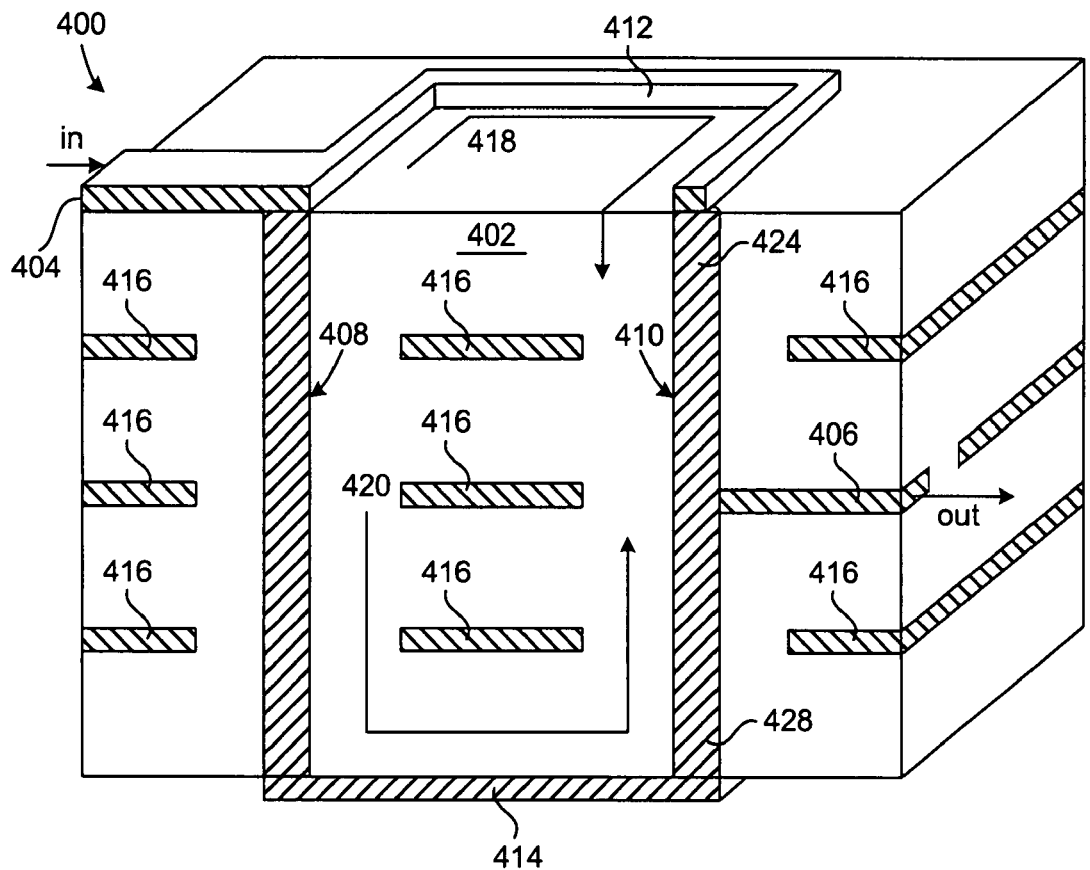
FIG. 4 is a cross-sectional perspective view of a circuit substrate, in accordance with an embodiment of the present invention.

FIG. 4 shows a cross-sectional perspective view of a multilayer printed circuit board (PCB) 400, in accordance with an embodiment of the present invention. As shown, PCB 400 includes a nonconductive substrate 402, a signal input layer 404, a signal output layer 406, a via 408, a via 410, a first (top) microstrip 412, a second (bottom) microstrip 414, and multiple ground planes 416. One skilled in the art will recognize that the terms "top" and "bottom" are being used merely to facilitate the description of the present invention as shown in the figures and should not be construed to limit the position of elements on PCB 400 (since for example PCB 400 can easily be flipped over). Substrate 402 may be a nonconductive board of, for example, FR4 or the like.

For convenience, vias herein are referred to as including an upper portion and a lower portion. The upper portion of a via refers to the portion above the point that contacts an input/output line (e.g., output line 406) to the point that contacts a top microstrip (e.g., first conductive microstrip 412). Similarly, the lower portion of a via refers to the portion below the point that contacts the input/output line (e.g., output line 406) to the point that contacts a bottom microstrip (e.g., second conductive microstrip 414). One skilled in the art will recognize that the terms "upper" and "lower" are being used merely to facilitate the description of the present invention as shown in the figures and should not be construed to limit the position of elements on PCB 400 (since for example PCB 400 can easily be flipped over).

Signal input layer 404 communicates with signal output layer 406 via first and second conductive paths 418 and 420. First conductive path 418 includes conductive microstrip 412 in series with upper via portion 424 of via 410. Second conductive path 420 includes via 408 in series with microstrip 414 further in series with lower via portion 428 of via 410. In one embodiment, first conductive path 418 and second conductive path 420 are designed to have substantially identical characteristic impedance and delay characteristics. Accordingly, a signal wave from signal input layer 404 splits into two equal waves (each half the power of the original wave) that rejoin at signal output layer 406 with minimal to no signal degradation. It will be appreciated that, since the circuit may be bidirectional, input nodes and output nodes may be switched.

Figure 5:
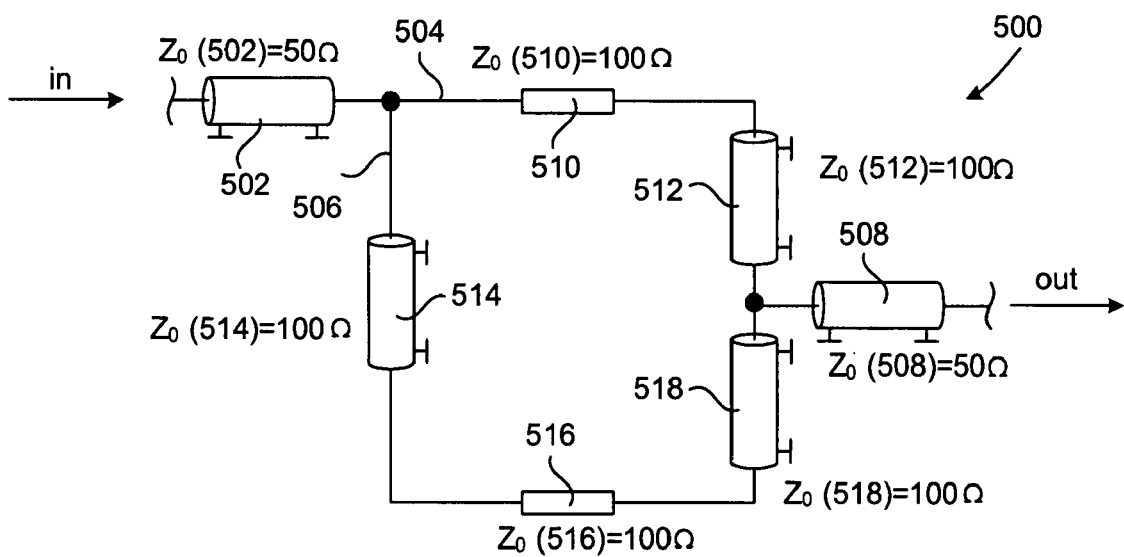
FIG. 5 is circuit diagram representing the circuit substrate of FIG. 4, in accordance with an embodiment of the present invention.

FIG. 5 is a circuit diagram of a circuit 500 representing PCB 400, in accordance with an embodiment of the present invention. Circuit 500 includes an interconnection of transmission line elements, namely, an input signal line 502, a first conductive path 504, a second conductive path 506 in parallel with first conductive path 504, and an output signal line 508. First conductive path 504 includes transmission line elements 510 and 512 representing first conductive microstrip 412 and upper via portion 424, respectively. Second conductive path 506 includes transmission line elements 514, 516, and 518 representing lower via portion 426, second conductive microstrip 414, and lower via portion 428, respectively. To avoid reflections, input signal line 502 and output signal line 508 are designed to have substantially equal characteristic impedance, e.g., 50 ohms. Further, transmission line elements 510, 512, 514, 516 and 518 are designed to have substantially equal characteristic impedance, each substantially equal to twice the characteristic impedance of the input signal line 502 or output signal line 508, e.g., 100 ohms. Further, first conductive path 504 is designed to have substantially the same delay as second conductive path 506.

As shown, transmission line element 510 has a characteristic impedance of Z0(510)=100 ohms, transmission line element 512 has a characteristic impedance of Z0(512)=100 ohms, transmission line element 514 has a characteristic impedance of Z0(514)=100 ohms, transmission line element 516 has a characteristic impedance of Z0(516)=100 ohms, and transmission line element 518 has a characteristic impedance of Z0(518)=100 ohms. Also, as shown, signal input line 502 has a characteristic impedance of Z0(502)=50 ohms, and output signal line 508 has a characteristic impedance of Z0(508)=50 ohms.

Accordingly, when a full-input signal from signal input line 502 reaches the point where first conductive path 504 and second conductive path 506 contact, the signal wave splits equally into two equal half-power signal waves that propagate down first conductive path 504 and second conductive path 506, respectively. The two half-power signal waves meet at signal output line 508, where they combine to form the original full-power input signal from input line 502, without or with reduced signal degradation.

Figure 6:
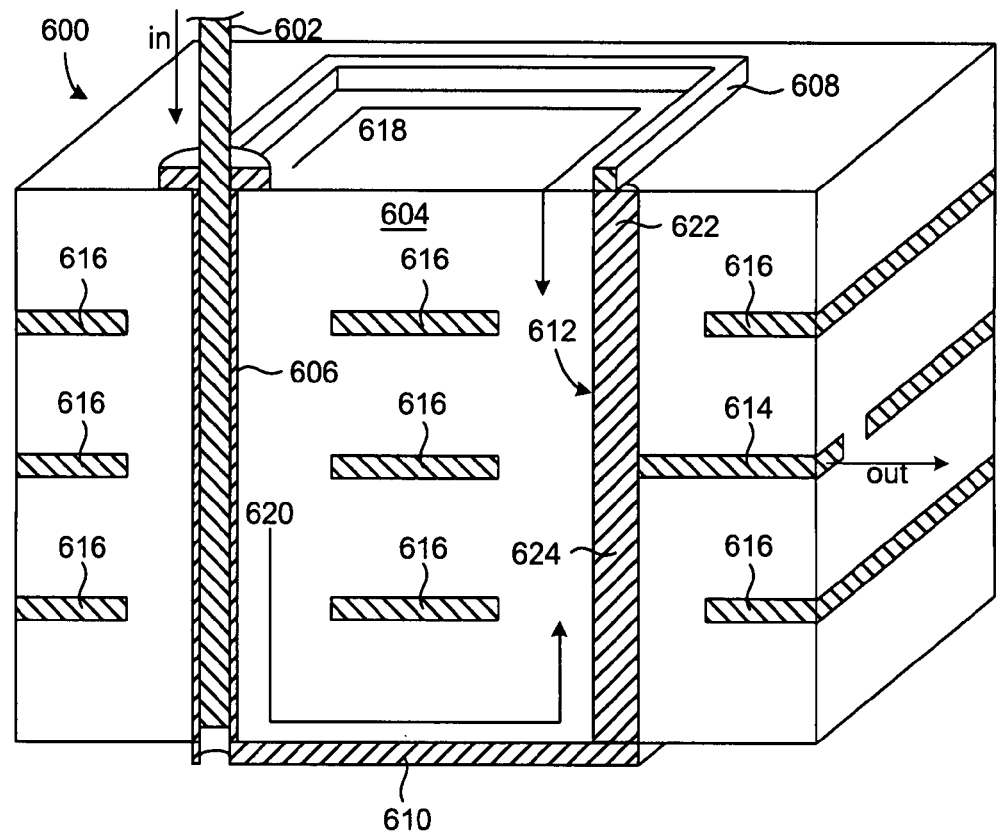
FIG. 6 is a cross-sectional perspective view of a circuit substrate, in accordance with an embodiment of the present invention.

FIG. 6 is an alternative embodiment showing a cross-sectional perspective view of multilayered PCB 600 electrically connected to a connecter pin 602 (e.g., backplane connector pin), in accordance with an embodiment of the present invention. PCB 600 includes a nonconductive substrate 604, a through-hole pin connector 606, a first conductive microstrip 608, a second conductive microstrip 610, a via 612, a signal output layer 614, and multiple ground planes 616. Substrate 602 may be a nonconductive board of, for example, FR4 or the like.

Similar to PCB 400, PCB 600 includes a first conductive path 618 and a second conductive path 620 in parallel with first conductive path 618 between pin 602 and signal output layer 614. First conductive path 618 includes first conductive microstrip 608 in series with upper via portion 622 of via 612. Second conductive path 620 includes pin 602 and pin receiver 606, both in series with second conductive microstrip 610, further in series with lower via portion 624 of via 612. First conductive path 618 and second conductive path 620 are designed to have substantially identical characteristic impedances and delays. Accordingly, a signal wave transmitted through pin 602 splits into two equal half-power waves that rejoin at signal output layer 614 to form the original input signal wave.

Figure 7:
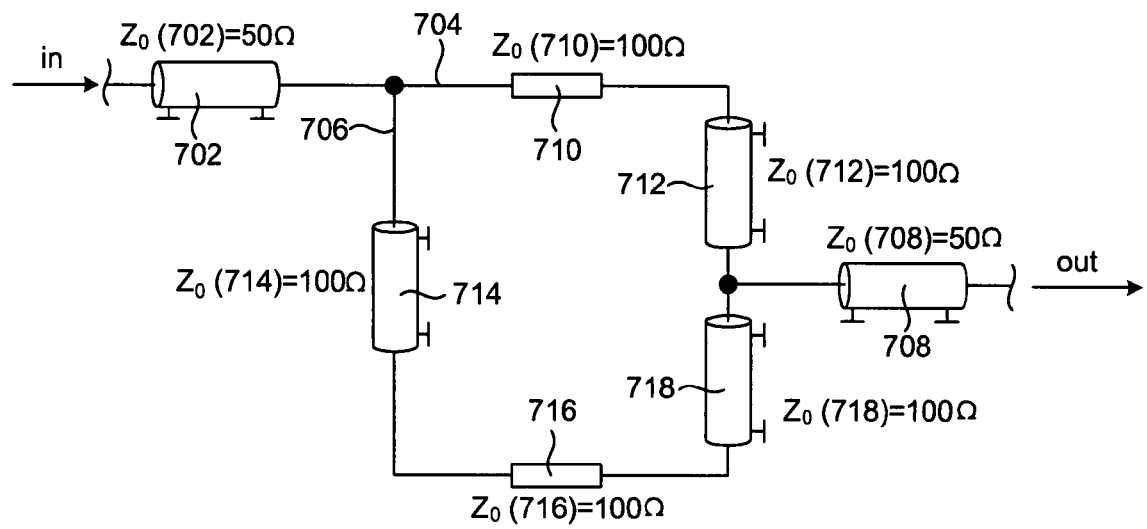
FIG. 7 is circuit diagram representing the circuit substrate of FIG. 6, in accordance with an embodiment of the present invention.

FIG. 7 is a circuit diagram of a circuit 700 representing PCB 600, in accordance with an embodiment of the present invention. Circuit 700 includes an interconnection of transmission line elements, namely, an input signal line 702, a first conductive path 704, a second conductive path 706, and an output signal line 708. First conductive path 704 includes transmission line element 710 and transmission line element 712 representing microstrip 608 and upper via portion 622, respectively. Second conductive path 706 includes transmission line element 714, transmission line element 716, and transmission line element 718 representing pin 602 and pin connector 606, microstrip 610, and lower via portion 624, respectively. To avoid reflections, input signal line 702 and output signal line 708 are designed to have substantially equal characteristic impedance, e.g., 50 ohms. Further, transmission line elements 710, 712, 714, 716 and 718 are designed to have substantially equal characteristic impedance, each substantially equal to twice the characteristic impedance of the input signal line 702 or output signal line 708, e.g., 100 ohms. Further, first conductive path 704 is designed to have substantially the same delay as second conductive path 706.

As shown, transmission line element 710 has a characteristic impedance of Z0(710)=100 ohms, transmission line element 712 has a characteristic impedance of Z0(712)=100 ohms, transmission line element 714 has a characteristic impedance of Z0(714)=100 ohms, transmission line element 716 has a characteristic impedance of Z0(716)=100 ohms, and transmission line element 718 has a characteristic impedance of Z0(718)=100 ohms. Also, as shown, signal input line 702 has a characteristic impedance of Z0(702)=50 ohms, and output signal line 708 has a characteristic impedance of Z0(708)=50 ohms.

Figure 8:
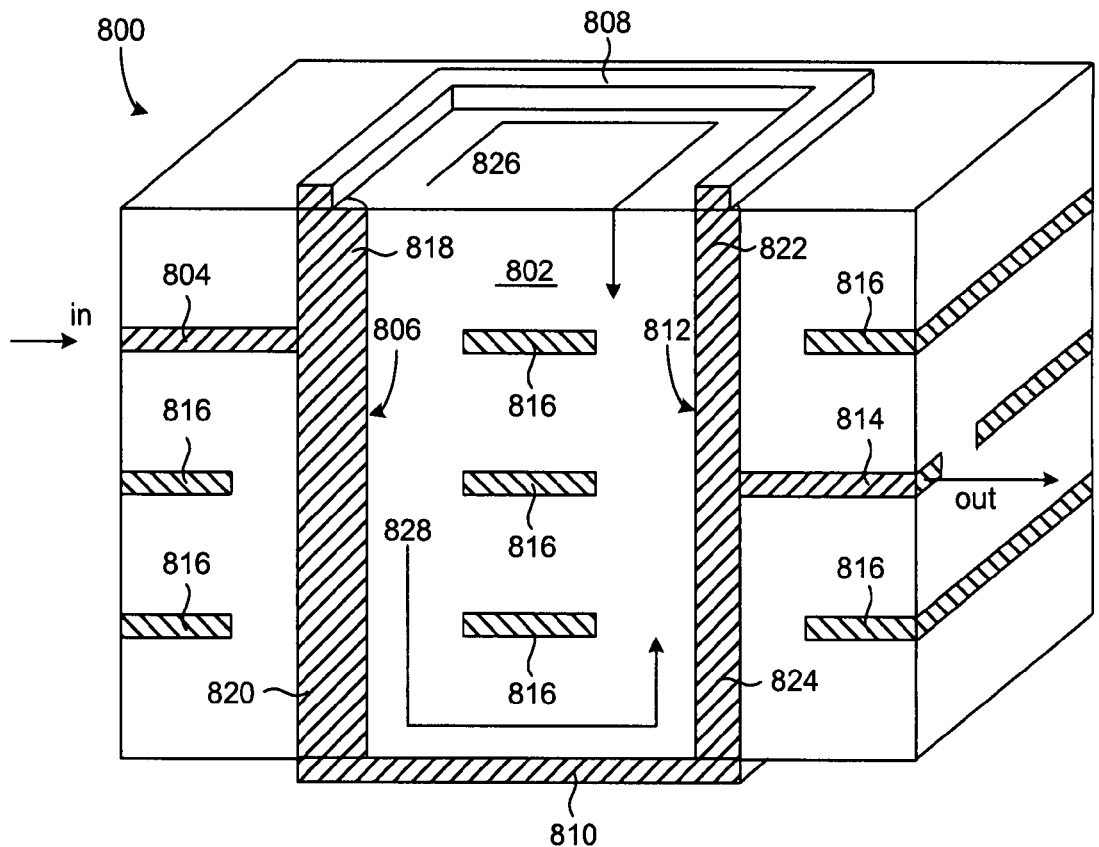
FIG. 8 is a cross-sectional perspective view of a circuit substrate, in accordance with an embodiment of the present invention.

FIG. 8 shows a cross-sectional perspective view of a multilayered PCB 800, in accordance with an embodiment of the present invention. PCB 800 includes a nonconductive substrate 802, a signal input layer 804, a first via 806, a first conductive microstrip 808, a second conductive microstrip 810, a second via 812, a signal output layer 814 and multiple ground planes 816. Substrate 802 may a nonconductive board of, for example, FR4 or the like. As shown in this embodiment, signal input layer 804 and signal output layer 814 are both intermediate layers within substrate 802.

Relative to signal input layer 804, first via 806 includes an upper via portion 818 and a lower via portion 820. Similarly, relative to output signal layer 814, second via 812 includes an upper via portion 822 and a lower via portion 824. First (top) conductive microstrip 808 provides electrical communication between upper via portion 818 and upper via portion 822. Similarly, second (bottom) conductive microstrip 810 provides electrical communication between lower via portion 820 and lower via portion 824.

Similar to PCB 400 and PCB 600, PCB 800 includes a first conductive path 826 and a second conductive path 828 in parallel with first conductive path 826 between signal input layer 804 and signal output layer 814. First conductive path 826 comprises upper via portion 818 in series with first conductive microstrip 808 further in series with upper via portion 822. Second conductive path 828 includes lower via portion 820 in series with microstrip 810 further in series lower via portion 824. Each of upper via portion 818, first conductive microstrip 808, upper via portion 822, lower via portion 820, microstrip 810, and lower via portion 824 have substantially identical characteristic impedances and delays, so that a signal wave transmitted from signal input layer 804 splits into two equal half-power waves that rejoin to form the original input signal wave at signal output layer 814.

One skilled in the art will recognize that characteristic impedance may be modified by modifying via and microstrip dimensions and/or materials used. For example, in some embodiments, designers and/or manufacturers may decrease and/or increase the width of vias, strips or microstrips to control characteristic impedance. Similarly, one skilled in the art will recognize that various delay techniques can be used to match the delay of the first conductive path 826 to the delay of the second conductive path 828. For example, signal propagation speeds can be modified by selecting from various materials. As another example, the length of conductive microstrip 808 and/or conductive microstrip 810 may be modified.

Figure 9:
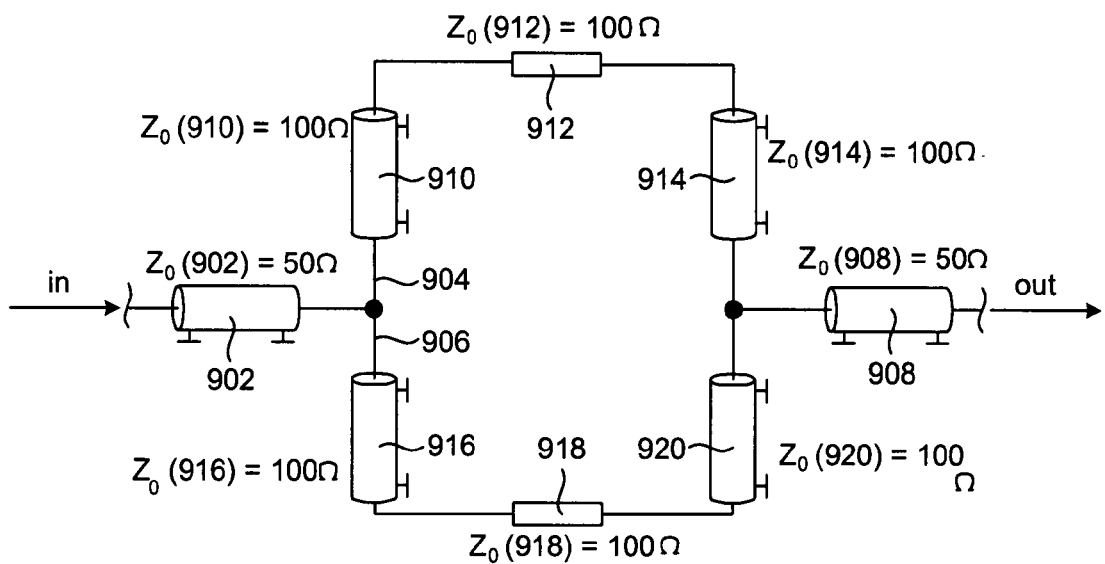
FIG. 9 is a circuit diagram representing the circuit substrate of FIG. 8, in accordance with an embodiment of the present invention.

FIG. 9 is a circuit diagram of a circuit 900 representing PCB 800, in accordance with an embodiment of the present invention. Circuit 900 includes an interconnection of transmission line element, namely, a signal input line 902, a first conductive path 904, a second conductive path 906, and a signal output line 908. First conductive path 904 includes transmission line element 910, transmission line element 912, and transmission line element 914 representing upper via portion 818, conductive microstrip 808 and upper via portion 822, respectively. Second conductive path 906 includes transmission line element 916, transmission line element 918, and transmission line element 920 representing lower via portion 820, conductive microstrip 810, and lower via portion 824, respectively. To avoid reflections, input signal line 902 and output signal line 908 are designed to have substantially equal characteristic impedance, e.g., 50 ohms. Further, transmission line elements 910, 912, 914, 916, 918 and 920 are designed to have substantially equal characteristic impedance, each substantially equal to twice the characteristic impedance of the input signal line 902 or output signal line 908, e.g., 100 ohms. Further, first conductive path 904 is designed to have substantially the same delay as second conductive path 906.

As shown, transmission line element 910 has a characteristic impedance of Z0(910)=100 ohms, transmission line element 912 has a characteristic impedance of Z0(912)=100 ohms, transmission line element 914 has a characteristic impedance of Z0(914)=100 ohms, transmission line element 916 has a characteristic impedance of Z0(916)=100 ohms, transmission line element 918 has a characteristic impedance of Z0(918)=100 ohms, and transmission line element 920 has a characteristic impedance of Z0(920)=100 ohms. Also, as shown, signal input line 902 has a characteristic impedance of Z0(902)=50 ohms, and output signal line 908 has a characteristic impedance of Z0(908)=50 ohms.

Figure 10:
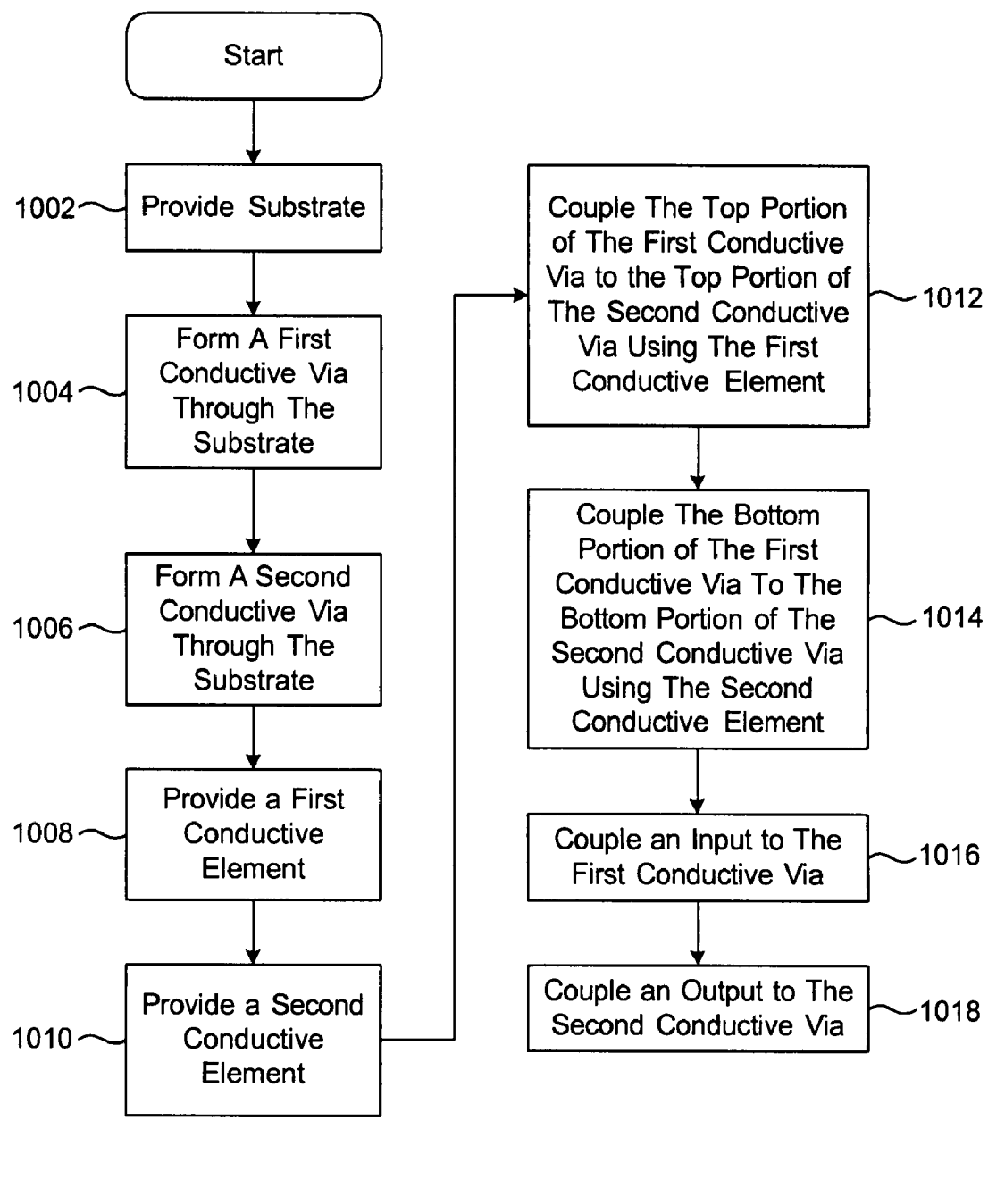
FIG. 10 is a flowchart describing a method for manufacturing a circuit substrate, in accordance with an embodiment of the present invention.

FIG. 10 is a flowchart illustrating a method 1000 for manufacturing a circuit substrate, in accordance with an embodiment of the present invention. These steps may be completed in parallel, in series, or in a combination of in parallel and in series. In step 1002, a circuit substrate is provided. Next, in step 1004, a first conductive via is formed through the circuit substrate. In step 1006, a second conductive via is formed through the circuit substrate. In step 1008, a first conductive element is provided. In step 1010, a second conductive element is provided. In step 1012, the upper portion of the first via is coupled to the top portion of the second via using the first conductive element. In step 1014, the lower portion of the first conductive via is coupled to the lower portion of the second conductive via using the second conductive element. In step 1016, the first conductive via is coupled to a signal input layer. In step 1018, the second conductive via is coupled to a signal output layer.

Many of the described features may be substituted, altered or omitted without departing from the scope of the present invention. For example, alternate electronic devices (e.g., various passive components) may be substituted for the microstrips. As another example, although the input and output forms have been described as layers and/or pins, other input and/or output node forms are also possible. These and other deviations from the particular embodiments shown will be apparent to those skilled in the art.

I claim:

1. A circuit substrate comprising:
   a first surface;
   a second surface;
   a first via having a first end near said first surface and a second end near said second surface;
   a second via having a first end near said first surface and a second end near said second surface;
   a first conductive element electrically coupling said first end of said first via and said first end of said second via;
   a second conductive element electrically coupling said second end of said first via and said second end of said second via;
   an input signal line coupled to said first via and operative to receive a signal; and
   an output signal line coupled to said second via and operative to provide said signal at an output; and wherein
   a first conductive path through said first conductive element has substantially the same delay as a second conductive path through said second conductive element;
   said input signal line and said output signal line are electrically coupled by said first conductive path, said first conductive path conducting a first portion of said signal between said input signal line and said output signal line through said first conductive element; and
   said input signal line and said output signal line are electrically coupled by said second conductive path, said second conductive path conducting a second portion of said signal between said input signal line and said output signal line through said second conductive element.

2. A circuit substrate according to claim 1, wherein said input signal line includes a conductive layer formed on an intermediate layer of said circuit substrate.

3. A circuit substrate according to claim 2, wherein said input signal line is physically coupled to said first via between said first end and said second end.

4. A circuit substrate according to claim 1, wherein said output signal line includes a conductive layer formed on an intermediate layer of said circuit substrate.

5. A circuit substrate according to claim 4, wherein said output signal line is physically coupled to said second via between said first end and said second end.

6. A circuit substrate according to claim 1, wherein
   said input signal line and said output signal line have substantially equal characteristic impedance; and
   said first via, said second via, said first conductive element, and said second conductive element have substantially equal characteristic impedance of substantially two times the characteristic impedance of the input signal line.

7. A circuit substrate according to claim 1, wherein at least one of said first conductive element and said second conductive element includes a microstrip.

8. A circuit substrate according to claim 1, wherein said first via has a characteristic impedance substantially equal to the characteristic impedance of said second via.

9. A circuit substrate according to claim 1, wherein at least one of said first via and said second via includes a through-hole pin connector via.

10. A circuit substrate according to claim 9, wherein said through-hole pin connector via is suitable to receive a backplane connector pin.

11. A circuit substrate comprising:
a first surface;
a second surface;
a first via having a first end near said first surface and a second end near said second surface;
a second via having a first end near said first surface and a second end near said second surface;
a first conductive element electrically coupling said first end of said first via and said first end of said second via;
a second conductive element electrically coupling said second end of said first via and said second end of said second via;
an input signal line coupled to said first via; and
an output signal line coupled to said second via; and wherein
said input signal line and said output signal line have substantially equal characteristic impedance; and
said first via, said second via, said first conductive element, and said second conductive element have substantially equal characteristic impedance of substantially two times the characteristic impedance of the input signal line.

12. A circuit substrate according to claim 11, wherein said input signal line includes a conductive layer formed on an intermediate layer of said circuit substrate.

13. A circuit substrate according to claim 12, wherein said input signal layer is physically coupled to said first via between said first end and said second end.

14. A circuit substrate according to claim 11, wherein said output signal line includes a conductive layer formed on an intermediate layer of said circuit substrate.

15. A circuit substrate according to claim 14, wherein said output signal line is physically coupled to said second via between said first end and said second end.

16. A circuit substrate according to claim 11, wherein at least one of said first conductive element and said second conductive element includes a microstrip.

17. A circuit substrate according to claim 11, wherein at least one of said first via and said second via includes a through-hole pin connector via.

18. A circuit substrate according to claim 17, wherein said through-hole pin connector via is suitable to receive a backplane connector pin.

19. A circuit substrate comprising:
a first surface;
a second surface;
a first via having a first end near said first surface and a second end near said second surface;
a second via having a first end near said first surface and a second end near said second surface;
a first conductive element electrically coupling said first end of said first via and said first end of said second via;
a second conductive element electrically coupling said second end of said first via and said second end of said second via;
an input signal line coupled to said first via and operative to receive a signal; and
an output signal line coupled to said second via and operative to provide said signal at an output; and wherein
said input signal line and said output signal line are electrically coupled by a first conductive path, said first conductive path conducting a first portion of said signal between said input signal line and said output signal line through said first conductive element;
said input signal line and said output signal line are electrically coupled by a second conductive path, said second conductive path conducting a second portion of said signal between said input signal line and said output signal line through said second conductive element;
said first via has a characteristic impedance substantially equal to the characteristic impedance of said second via.

20. A circuit substrate according to claim 19, wherein said input signal line includes a conductive layer formed on an intermediate layer of said circuit substrate.

21. A circuit substrate according to claim 20, wherein said input signal line is physically coupled to said first via between said first end and said second end.

22. A circuit substrate according to claim 19, wherein said output signal line includes a conductive layer formed on an intermediate layer of said circuit substrate.

23. A circuit substrate according to claim 22, wherein said output signal line is physically coupled to said second via between said first end and said second end.

24. A circuit substrate according to claim 19, wherein at least one of said first conductive element and said second conductive element includes a microstrip.

25. A circuit substrate according to claim 19, wherein at least one of said first via and said second via includes a through-hole pin connector via.

26. A circuit substrate according to claim 25, wherein said through-hole pin connector via is suitable to receive a backplane connector pin.

* * * * *